United States Patent
Liu et al.

(10) Patent No.: US 7,052,808 B2
(45) Date of Patent: May 30, 2006

(54) TRANSMISSION MASK WITH DIFFERENTIAL ATTENUATION TO IMPROVE ISO-DENSE PROXIMITY

(75) Inventors: Hang Yip Liu, Montrose, NY (US);
Sebastian Schmidt, Dresden (DE);
Benjamin Szu-Min Lin, Hsinchu (TW)

(73) Assignees: Infineon Technologies AG (DE);
United Microelectronics Co. (TW)

( * ) Notice: Subject to any disclaimer, the term of this patent is extended or adjusted under 35 U.S.C. 154(b) by 293 days.

(21) Appl. No.: 10/364,664

(22) Filed: Feb. 11, 2003

(65) Prior Publication Data

US 2004/0157135 A1    Aug. 12, 2004

(51) Int. Cl.
*G03F 1/08* (2006.01)

(52) U.S. Cl. .............................. 430/5; 716/19; 378/34; 378/35

(58) Field of Classification Search ............ 430/5, 430/311, 322; 355/67
See application file for complete search history.

(56) References Cited

U.S. PATENT DOCUMENTS

| | | | |
|---|---|---|---|
| 5,817,438 A | 10/1998 | Chen et al. | |
| 6,114,095 A | 9/2000 | Nakabayashi et al. | |
| 6,274,281 B1 | 8/2001 | Chen | |
| 6,294,295 B1 | 9/2001 | Lin et al. | |
| 2002/0132173 A1 | 9/2002 | Rolfson | |
| 2004/0023134 A1* | 2/2004 | Rolfson | 430/5 |

OTHER PUBLICATIONS

Kachwala, Nishrin; High Transmission attenuated PSM as a Viable Optical Extension Technique; Sep. 2001; Proc. SPIE vol. 4346, Optical Microlithography XIV, Christopher J. Progler: Ed., Abstract, pp. 807 and 811 only.

* cited by examiner

*Primary Examiner*—John A. McPherson
*Assistant Examiner*—Daborah Chacko-Davis
(74) *Attorney, Agent, or Firm*—Brinks Hofer Gilson & Lione

(57) ABSTRACT

An apparatus, system and method to compensate for the proximity effects in the imaging of patterns in a photolithography process. A light exposure of a photoresist layer is effectuated in predetermined patterns through an exposure mask having light-transmissive openings in correspondence to the predetermined patterns. The exposure mask has areas densely populated with the light-transmissive openings and areas sparsely populated with the light-transmissive openings. Light is attenuated through the densely populated light-transmissive openings by a different amount than through the sparsely populated light-transmissive openings.

19 Claims, 4 Drawing Sheets

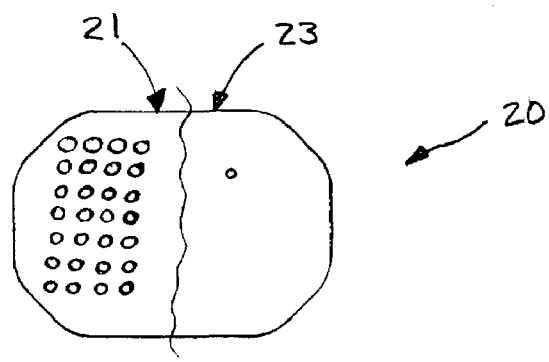
FIG. 2
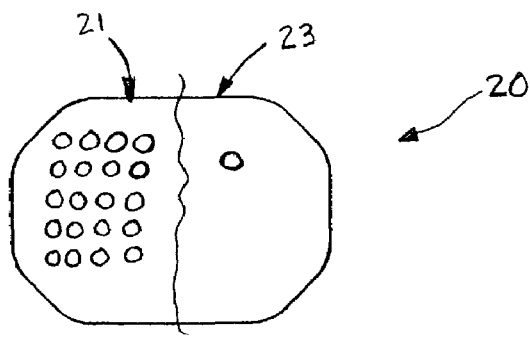
FIG. 2A
| Att % | transmission | iso contact | nested contact |
|---|---|---|---|
| 12 | | NA | 247.5 |
| 9 | | 210.9 | 243.7 |
| 6 | | 215.8 | 243.2 |
| 4 | | 222.5 | 245.2 |
| 2 | | 230.0 | 251.6 |
| 1 | | 237.8 | NA |
| COG | | 275.8 | NA |
FIG. 3

TRANSMISSION MASK WITH DIFFERENTIAL ATTENUATION TO IMPROVE ISO-DENSE PROXIMITY

BACKGROUND OF THE INVENTION

1. Technical Field of the Invention

The present invention relates generally to photolithography and, more specifically, to correction of photoresist bias between isolated patterns and dense patterns.

2. Description of Related Art

Photolithography is commonly used during formation of integrated circuits on semiconductor wafers. More specifically, a form of radiant energy (such as, for example, ultraviolet light) is passed through a radiation-patterning tool (e.g. photomasks and reticles) and onto a semiconductor wafer. Conventional photomasks and reticles contain light-restrictive regions (i.e., totally opaque or attenuated regions) and light-transmissive regions (i.e., totally transparent regions) formed in a desired pattern. A grating pattern, for example, can be used to define parallel-spaced conductive lines on a semiconductor wafer. The wafer is provided with a layer of photosensitive resist material commonly referred to as photoresist. Radiation is passed through the radiation-patterning tool onto the layer of photoresist and the features of the mask pattern are transferred to the photoresist. The photoresist is then developed to remove either the exposed portions of photoresist for a positive photoresist or the unexposed portions of the photoresist for a negative photoresist. The remaining patterned photoresist can then be used as a mask on the wafer during a subsequent semiconductor fabrication step, such as, for example, ion implantation or etching relative to materials on the wafer proximate the photoresist.

A method of forming a radiation-patterning tool is to provide a layer of light-restrictive material (such as, for example, chrome) over a light-transmissive substrate (such as, for example, a fused silicon such as quartz), and subsequently etch a pattern into the light-restrictive material.

In a typical process of fabricating semiconductor circuitry, a desired circuit pattern will be designed, and subsequently a radiation-patterning tool will be formed to create the pattern. A problem in forming the radiation-patterning tool is in correlating particular pattern shapes desired in the integrated circuitry to pattern shapes utilized in the tool. Specifically, a pattern shape formed in a tool will typically not be identical to a pattern shape generated with the tool. Light passing through a reticle tends to be refracted and scattered by the chromium edges causing interference patterns. This causes the projected image to exhibit some rounding and/or other optical distortion. The problems become especially pronounced in IC designs having feature sizes near the wavelength of light used in the photolithographic process. If the transfer of the mask pattern is not correct, it may introduce variances that exceed the tolerance of the critical dimension (CD) on the wafer.

This optical distortion (also known as the proximity effect) can be compensated for, at least in part, by modifying any given feature in the opposite direction to the expected bias. Thus, a line that would otherwise come out too narrow can be drawn as wider than its true width, etc. The overall nature and scope of these corrections will vary with the particular photolithography process that is being used.

One obvious way to avoid this phenomena is to relax the design rules of the circuit such that the CDs are not at the resolution limit of the exposure tool. However, increasing CDs, yields larger die sizes. Larger die and circuit sizes have many undesirable characteristics such as high defect densities and slower circuit speeds. Also, not utilizing the exposure tool to its fullest capabilities is not a cost effective practice.

Another solution to the proximity effect is the use of optical proximity correction (OPC). OPC compensates for the proximity effect by altering the mask image such that the resulting pattern matches the desired pattern of the non-altered mask image. Optical proximity correction involves adding dark regions to and/or subtracting dark regions from a reticle design at locations chosen to resolve the distorting effects of diffraction and scattering, for example. Typically, OPC is performed on a digital representation of a desired IC pattern. First, the digital pattern is evaluated using software to identify regions where optical distortion is apt to result. Optical proximity correction is then applied to compensate for the distortion. The resulting pattern is ultimately transferred to the reticle glass.

The OPC process is generally performed by scanning a digital version of an IC layout design to identify feature dimensions, interfeature spacing, feature orientation, etc. The scanning process may proceed across the IC layout design in a rasterized fashion to cover the entire pattern. In some IC layout designs, it may also be necessary to conduct raster scans in the two or more directions (e.g., horizontal, vertical, and one or more diagonal directions). In some cases, the OPC computations may include generating a detailed computer model of a reticle image known as a Fast Aerial Image of Mask (FAIM). This image is then itself evaluated to determine where to make reticle corrections.

However, a drawback is encountered in that the process of performing OPC on modern IC layout designs having many features can be computationally intensive. In fact, OPC can sometimes be too great for even the most advanced computational resources. Obviously, when FAIM models are used, the computational difficulty increases significantly.

Consequently, a method and apparatus are desired which eliminate the need for different photolithography masks to compensate for bias between isolated and dense mask patterns. It would also be desired that the method and apparatus eliminate the need to use more complicated design and production of OPC masks to compensate for the bias.

SUMMARY OF THE INVENTION

The present invention achieves technical advantages as an apparatus, system and method of compensating for the proximity effects in the imaging of patterns in a photolithography process in which a light exposure of a photoresist layer is effectuated in predetermined patterns through an exposure mask having light-transmissive openings in correspondence to the predetermined patterns. Light is attenuated differently through light-transmissive openings associated with a dense pattern than through light-transmissive openings associated with a sparse pattern.

BRIEF DESCRIPTION OF THE DRAWINGS

For a more complete understanding of the present invention, reference is made to the following detailed description taken in conjunction with the accompanying drawings wherein:

FIGS. 2–2A illustrates a top view of a wafer following photoresist contact hole printing having both a dense contact pattern portion and a sparse contact pattern portion;

FIG. 3 illustrates shows tabulated results of simulated data for a given photoresist processing time in accordance with an embodiment of the present invention;

DETAILED DESCRIPTION

Figure 1:
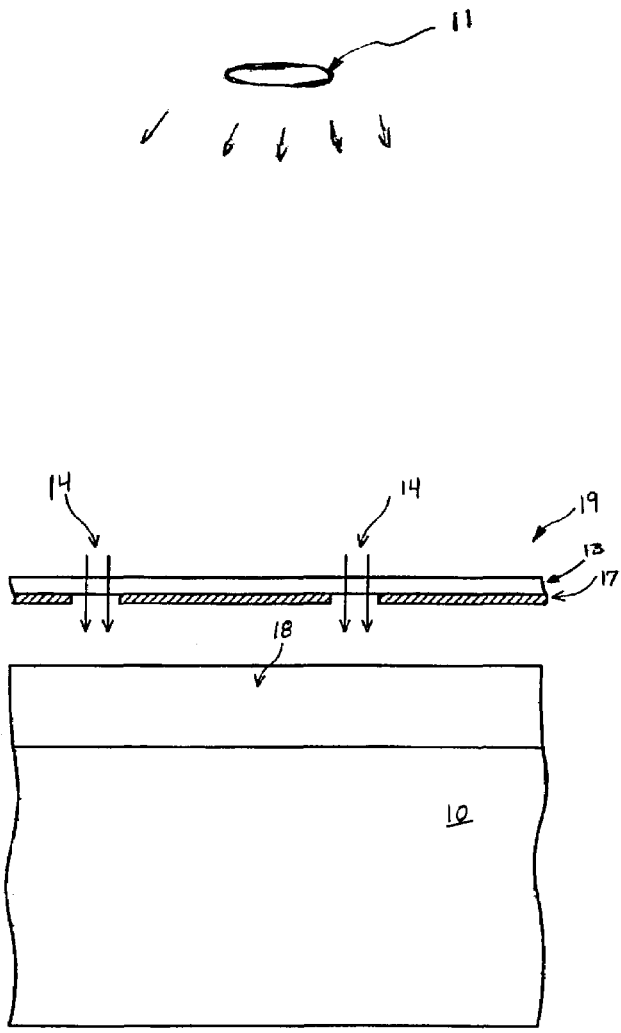
FIGS. 1–1A illustrate, in cross section, the process for etching contacts according to the prior art.

The numerous innovative teachings of the present application will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others. Throughout the drawings, it is noted that the same reference numerals or letters will be used to designate like or equivalent elements having the same function. Detailed descriptions of known functions and constructions unnecessarily obscuring the subject matter of the present invention have been omitted for clarity.

Figure 1A:
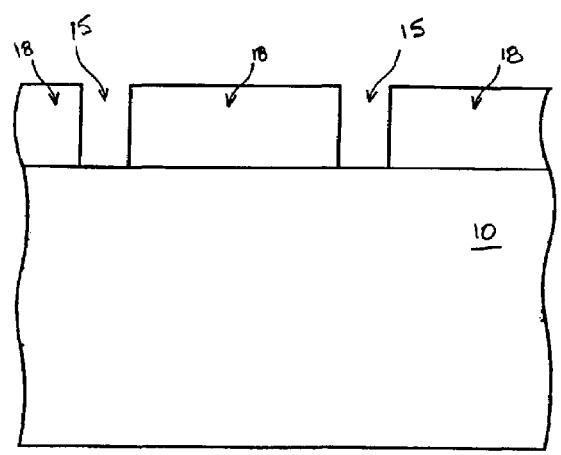

FIG. 1 illustrates a conventional photolithography process which includes a light source 11, a wafer 10 coated with photoresist 18, and a conventional mask 19. The mask 19 allows full light transmission 14 through its contact pattern, and is used to define the etching windows on photoresist 18. In FIG. 1A, the etching windows are defined after the development of photoresist 18, wherein there is no residual photoresist layer within the etching windows 15. Typically anisotropical etching is used to etch the contacts. The mask 19 typically includes a light-transmissive quartz substrate 13 and a light-restrictive chromium layer 17 etched to define the contact pattern.

Semiconductor designs often require a wafer to have very dense contact patterns (i.e. regions in which many contact areas are nested together) and very sparse contact patterns that have few contact areas. FIG. 2 shows a top view of a wafer 20 following photoresist contact hole printing having both a dense contact pattern portion 21 and a sparse contact pattern portion 23. FIG. 2 illustrates conventional results of photoresist contact hole printing with a photomask having both a dense and a sparse contact pattern. Note the contact etching window on the wafer 20 in the sparse portion 23 is smaller than the contact etching windows in the dense portion 21. If two pattern elements are closely adjacent, each element emits scattering electrons to the neighboring element from which it also receives scattering electrons.

When a conventional mask having both dense and sparse contact patterns is illuminated, the intensity of the radiation passing through the dense pattern is stronger than that of a sparse pattern. This difference in intensity results in a bias between the dense and sparse patterns in which the photoresist in a dense contact receive more exposure and results in a larger contact etching window than in the sparse areas. FIG. 2A illustrates ideal results of photoresist contact hole printing in which contact etching windows in the dense and sparse portions are substantially the same size and shape.

An aspect of the present invention is to normalize the intensity of the radiation, such that the resulting photoresist pattern matches the desired pattern of the mask image without altering the mask image. That is, the radiation passing through a dense pattern is attenuated more than that of the sparse pattern, such that the photoresist radiation exposure of both dense and sparse patterns fall within the same intensity range, thereby reducing or eliminating the bias caused by under or over exposure.

Firstly, in a method to compensate for the proximity effect, in accordance with exemplary embodiments of the present invention, the corresponding percentage transmissivity needed for the dense and sparse patterns which will result in similar size contact holes (or other desired features in the post-development photoresist) is determined from experimentation or simulation, for example. The determined results can then be tabulated.

FIG. 3 shows tabulated results of simulated data for a given photoresist processing time in accordance with an embodiment of the present invention. The first column 31 lists the attenuated transmission in a percentage value, column 33 correlates the critical dimension of an isolated photoresist contact hole at the determined percent attenuation, and column 35 correlates the critical dimension of photoresist contact holes in a nested/dense pattern. For example, if a photoresist contact hole of approximately 240 nanometers is desired, an attenuation factor of 1% is selected from the table for the isolated contact (which has a simulated result with a CD of approximately 237.8 nanometers) and an attenuation factor of 6% is selected for the nested contacts (which has a simulated result with a CD of approximately 243.2 nanometers). Using the same example, the next step is to tune a photomask using the determined attenuations, such that a first contact pattern has an attenuation of 1% and a second contact pattern has an attenuation of 6%. Lastly, photoresist processing is effectuated using the tuned photomask.

Figure 4:
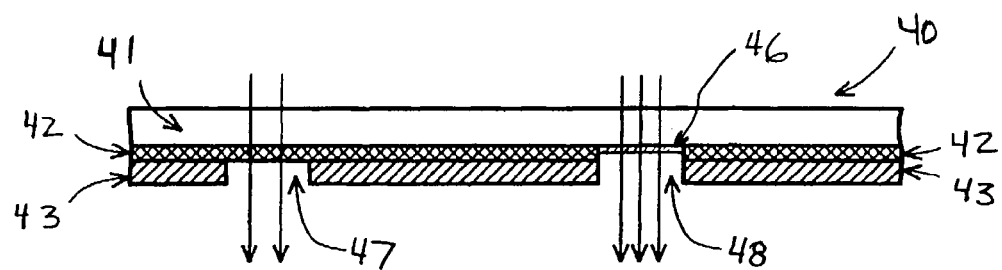
FIG. 4 shows a photomask structure in accordance with an embodiment of the present invention.

Referring now to FIG. 4 there is shown a photomask structure in accordance with exemplary embodiments of the present invention. The mask structure 40 includes a support glass 41) e.g., quartz); a layer of chromium 43, which blocks the light completely; a layer of partial light shielding material 42, which determines how much light is to be transmitted by its thickness; a first contact pattern 48; and a second contact pattern 47. The layer of chromium 43 and a portion of the partial light shielding material 42 over the support glass 41 are etched at 46 to produce the first contact pattern 48, which allows light transmission determined from the thickness of the partial light shielding material 42 remaining in the first contact pattern 48. The second contact pattern 47 has only the chromium layer etched and allows light transmission determined from the thickness of the partial light shielding material 42. For the above-mentioned example, the first contact pattern 48 is tuned for a sparse contact pattern and the second contact pattern 47 is tuned for a dense contact pattern.

Figure 5:
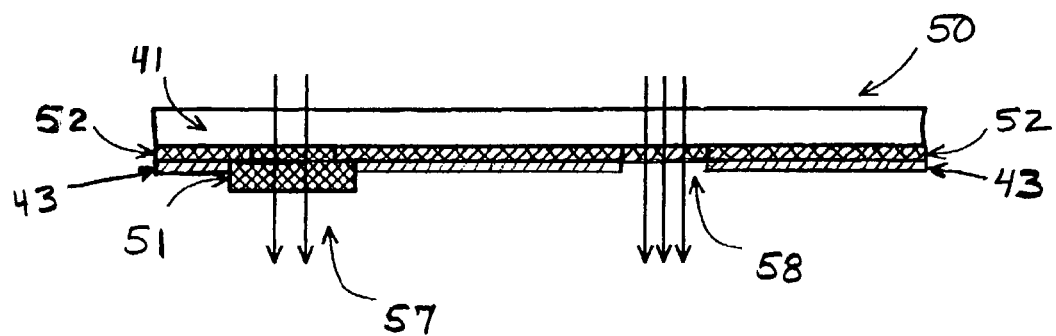
FIG. 5 shown a photomask structure in accordance with another embodiment of the present invention.

Referring now to FIG. 5 there is shown another photomask structure in accordance with exemplary embodiments of the present invention. The mask structure 50 includes a support glass 41; a layer of chromium 43, which blocks the light completely; a layer of a partial light shielding material 52, which determines how much light is to be transmitted by its thickness; a first contact pattern 58; and a second contact pattern 57. The layer of chromium 43 over the support glass 41 is etched to produce the first contact pattern 58, which allows a determined light transmission. The second contact pattern 57 has the chromium layer 43 etched and has a second layer of a partial light shielding material 51. The partial light shielding material layers (51 and 52) can be the same material or different materials. FIGS. 4 and 5 illustrate photomasks with only two different partial light contact patterns however, photomasks with more than two different partial light contact patterns are contemplated. In addition, FIGS. 4 and 5 illustrate only two approaches for tuning a photo mask although other approaches are contemplated.

Figure 4A:
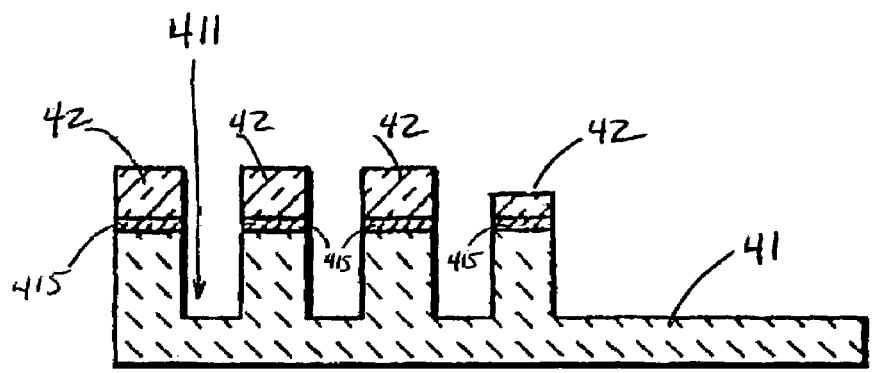
FIGS. 4A and 4B photomask structures in accordance with another embodiment of the present invention.
Figure 4B:
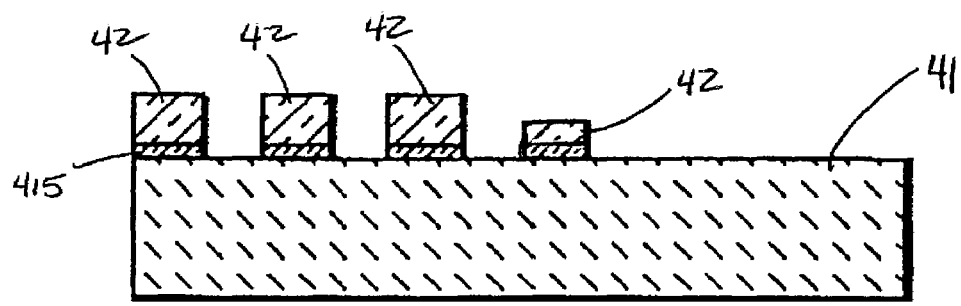

The present variable transmission mask and method can be incorporated with conventional phase shift type masks. In comparison with conventional reticles, phase shift masks (PSM) typically incorporate shifter regions within the conventional chrome metal-on-glass reticle construction. Typically, phase-shifting is achieved by passing light through areas of a transparent material of either differing thicknesses or through materials with different refractive indexes or both thereby changing the phase or the periodic pattern of the light wave. Specifically, light rays passing through the transparent substrate and the shifter regions have different optical path lengths, and thus emerge from those surfaces with different phases in a manner well known in the art. Application of the above-described variable transmission pattern with a PSM, as shown, for example, in FIGS. 4A and 4B, enables an attenuated PSM with multiple attenuation regions. The thicker or thinner transparent regions can be effectuated by etching 411 the support glass 41, by depositing a layer of phase shift material 415 (such as silicon nitride), or by a combination of both, to achieve a desired thickness that corresponds to a desired phase shift. Such PSM techniques are known in the art. These shifter regions are designed to produce a thickness related to the wavelength of light passing through the phase shift mask. In some embodiments of the present invention, differing thicknesses of the attenuating material 42, as above-described, are applied as shown in FIGS. 4A and 4B.

Although a preferred embodiment of the method and system of the present invention has been illustrated in the accompanied drawings and described in the foregoing Detailed Description, it is understood that the invention is not limited to the embodiments disclosed, but is capable of numerous rearrangements, modifications, and substitutions without departing from the spirit of the invention as set forth and defined by the following claims.

What is claimed is:

1. A photomask apparatus, comprising:
a transparent support glass;
a first light attenuator secured to said transparent support glass and cooperable therewith for creating in a photoresist material a first pattern of features having a first feature density, said first light attenuator for imposing a first amount of attenuation on light that passes through said transparent support glass; and
a second light attenuator secured to said transparent support glass and cooperable therewith for creating in the photoresist material a second pattern of features having a second feature density that differs from said first feature density, said second light attenuator for imposing on light that passes through said transparent support glass a second amount of attenuation that differs from said first amount of attenuation, where the first light attenuator and second light attenuator include first and second portions of a single layer of partial light shielding material overlying and secured to the transparent support glass, the first amount of attenuation corresponding to a thickness of the first light attenuator from the support glass and the second amount of attenuation corresponding to a thickness of the second light attenuator from the support glass, where the thickness of the first light attenuator differs from the second light attenuator.

2. The apparatus of claim 1, wherein said first feature density is greater than said second feature density, and said first amount of attenuation is greater than said second amount of attenuation.

3. The apparatus of claim 1, wherein all of the features of said first and second patterns are of substantially equal dimension.

4. The apparatus of claim 1, wherein said features correspond to contact holes.

5. The apparatus of claim 1, wherein said first and second light attenuators respectively overlie first and second portions of said transparent support glass, and including a layer of reflective material overlying a third portion of said transparent support glass other than said first and second portions thereof.

6. The apparatus of claim 1, wherein said first and second light attenuators respectively include first and second portions of a layer of partial light shielding material, comprising phase shift material.

7. The apparatus of claim 6, including a layer of reflective material overlying a third portion of said layer of partial light shielding material other than said first and second portions thereof, wherein said first portion of said layer of partial light shielding material is thicker than said second portion thereof, and wherein said first feature density is greater than said second feature density.

8. The apparatus of claim 6, including a layer of reflective material overlying a third portion of said layer of partial light shielding material other than said first and second portions thereof, and wherein said first light attenuator includes a further layer of partial light shielding material overlying said first portion of said partial light shielding material.

9. The apparatus of claim 1, wherein said transparent support glass is quartz.

10. The apparatus of claim 1 further including a phase shifter for producing in light passing through a first portion of said transparent support glass a phase shift relative to light passing through a second portion of said transparent support glass, said phase shifter cooperable with said first light attenuator for creating in the photoresist material said first pattern of features.

11. The apparatus of claim 1, wherein a first portion of said transparent support glass has a thickness which is less than a thickness of a second portion thereof, thereby to produce in light passing through said first portion of said transparent support glass a phase shift relative to light passing through said second portion of said transparent support glass.

12. The apparatus of claim 1, wherein said first amount of attenuation is based on said first feature density and said second amount of attenuation is based on said second feature density.

13. An imaging system, comprising:
a radiation source;
a radiation sensitive material; and
an exposure mask disposed between said radiation source and said radiation sensitive material, said exposure mask including radiation reflective areas and radiation-transmissive openings, said exposure mask for exposing said radiation sensitive material only to radiation which passes through said radiation-transmissive openings, said exposure mask having a first area wherein some of said radiation-transmissive openings are distributed in a first density, and having a second area wherein some of said radiation-transmissive openings are distributed in a second density which differs from said first density; and said exposure mask including a differential attenuator cooperable with said radiation-transmissive openings, said differential attenuator for attenuating radiation passing through the radiation-transmissive openings of said first area by a first amount of attenuation, and said differential attenuator for attenuating radiation passing through the radiation-transmissive openings in said second area by a second amount of attenuation that differs from said first amount of attenuation, where the differential attenuator comprises a single layer of material overlying and secured to a transparent support glass, the first amount of attenuation corresponding to a thickness of the differential attenuator from the support glass and the second amount of attenuation corresponding to a thickness of the differential attenuator from the support glass, where the thickness of differential attenuation the first area differs from the thickness of the differential attenuation in the second area.

14. The system of claim 13, wherein said first density is greater than said second density, and said first amount of attenuation is greater than said second amount of attenuation.

15. The system of claim 13, wherein said differential attenuator includes a partial radiation shielding material having first and second thicknesses thereof disposed in said radiation-transmissive openings of said first and second areas, respectively, and wherein said first thickness is greater than said second thickness.

16. The system of claim 15, wherein said first density is greater than said second density.

17. The system of claim 13, wherein said differential attenuator includes a first layer of partial radiation shielding material disposed in said radiation-transmissive openings of said first and second areas, and a second layer of partial radiation shielding material disposed in said radiation-transmissive openings of said first area.

18. The system of claim 17, wherein said first density is greater than said second density.

19. The system of claim 13, wherein said first amount of attenuation is based on said first density and said second amount of attenuation is based on said second density.

* * * * *